US009529190B2

(12) United States Patent
Nakazawa et al.

(10) Patent No.: US 9,529,190 B2
(45) Date of Patent: Dec. 27, 2016

(54) OPTICAL SCANNING DEVICE AND LASER MACHINING DEVICE

(71) Applicant: KAWASAKI JUKOGYO KABUSHIKI KAISHA, Kobe-shi, Hyogo (JP)

(72) Inventors: Mutsuhiro Nakazawa, Kobe (JP); Kazunori Takahara, Kobe (JP); Osami Oogushi, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 320 days.

(21) Appl. No.: 14/388,958

(22) PCT Filed: Mar. 25, 2013

(86) PCT No.: PCT/JP2013/001992
§ 371 (c)(1),
(2) Date: Sep. 29, 2014

(87) PCT Pub. No.: WO2013/145683
PCT Pub. Date: Oct. 3, 2013

(65) Prior Publication Data
US 2015/0069027 A1 Mar. 12, 2015

(30) Foreign Application Priority Data
Mar. 29, 2012 (JP) .................................. 2012-075830

(51) Int. Cl.
G02B 26/12 (2006.01)
B23K 26/08 (2014.01)
H01L 31/04 (2014.01)

(52) U.S. Cl.
CPC ......... *G02B 26/122* (2013.01); *B23K 26/0821* (2015.10); *B23K 26/0846* (2013.01); *G02B 26/126* (2013.01); *H01L 31/04* (2013.01)

(58) Field of Classification Search
CPC ..... G02B 26/12; G02B 26/122; G02B 26/126; B23K 26/08; B23K 26/0846; B23K 26/0815

(Continued)

(56) References Cited

U.S. PATENT DOCUMENTS

| 4,975,626 A * | 12/1990 | Yagi ....................... H04N 1/053 318/567 |
| 6,449,036 B1 * | 9/2002 | Wollmann ............. G01B 11/24 356/237.1 |
| 2002/0018112 A1 * | 2/2002 | Nishiguchi .............. B41J 2/471 347/259 |

FOREIGN PATENT DOCUMENTS

| JP | H07-178581 A | 7/1995 |
| JP | H08-146322 A | 6/1996 |

(Continued)

OTHER PUBLICATIONS

Oct. 1, 2014 International Preliminary Report of Patentability issued in International Patent Application No. PCT/JP2013/001992.

(Continued)

Primary Examiner — Samuel M Heinrich
(74) Attorney, Agent, or Firm — Oliff PLC

(57) ABSTRACT

An optical scanning device includes: a projector configured to radiate laser light incident thereon while causing the laser light to make angular movement around a projection center, and a reflector with a parabolic surface, the reflector being configured to reflect the laser light from the projector. The projection center is positioned at a focal point of the parabolic surface. The projector radiates the laser light such that the greater a difference between a rotation angle of the laser light and a reference angle, the lower an angular speed of the laser light, the reference angle being the rotation angle of the laser light when the laser light reflects on a vertex of the parabolic surface. A laser machining device includes the optical scanning device, and is configured to cause the laser light from the reflector to fall on a workpiece to form a machining line.

18 Claims, 5 Drawing Sheets

(58) Field of Classification Search
 USPC .................................... 219/121.68, 121.69
 See application file for complete search history.

(56) References Cited

FOREIGN PATENT DOCUMENTS

JP    2779053 B2    7/1998
JP    A-2011-625    1/2011

OTHER PUBLICATIONS

Apr. 16, 2013 International Search Report issued in International Patent Application No. PCT/JP2013/001992.

\* cited by examiner

OPTICAL SCANNING DEVICE AND LASER MACHINING DEVICE

TECHNICAL FIELD

The present invention relates to an optical scanning device configured to scan laser light, and to a laser machining device including such an optical scanning device, the laser machining device being configured to form machining lines in a workpiece with the laser light.

BACKGROUND ART

In factories producing thin-film solar cells, a patterning process is performed on a workpiece by using a laser machining device. The workpiece includes a glass substrate. On one surface of the glass substrate, a metal film or a semiconducting material film such as a silicon film is formed. In the patterning process, laser light is linearly scanned on the surface of such a thin-film layer of the workpiece, and thereby the thin-film layer is partially removed along a scanning line of the laser light. As a result, a straight groove (a scribe line) is formed.

Generally speaking, pulse laser light is applied as the laser light of laser machining devices for use in such a patterning process, because, for example, the use of pulse laser light makes micromachining possible and allows thermal influences to be readily reduced. In a case where pulse laser light is applied as the laser light, the laser light is scanned such that the irradiation range of the laser light oscillated at one timing partially overlaps, on the workpiece, with the irradiation range of the laser light oscillated one pulse width prior to the laser light oscillated at the one timing. In this manner, the continuity of the scribe line is assured. It should be noted that an area where the irradiation ranges of the laser light of such adjoining two pulses overlap each other is called an "overlap margin".

There is a known conventional laser machining device configured to reflect laser light from a deflector by means of a mirror fixed on an arc, such that the laser light reflected by the mirror falls on a workpiece (see Patent Literature 1, for example). In this laser machining device, the deflection center of the deflector is positioned at the center of the arc. This configuration is intended to cause the laser light to be incident on the workpiece substantially perpendicularly regardless of a rotation angle of the deflector, and make the length of an optical path from the deflection center to the workpiece substantially constant regardless of the rotation angle of the deflector. A camera is disposed such that its image-capturing axis is coaxial with the beam of the light. The position and output of the laser light are controlled based on position and type information about the workpiece, the information being obtained from an image captured by the camera. On the workpiece, a mask may be placed in an area where the laser light falls on, and thereby a wide variety of machining can be performed.

CITATION LIST

Patent Literature

PTL 1: Japanese Laid-Open Patent Application Publication No. 2011-000625

SUMMARY OF INVENTION

Technical Problem

However, although a motor with high mobility is used as a motor for driving the deflector of the laser machining device disclosed in Patent Literature 1, Patent Literature 1 does not take account of the operating speed of the deflector and the scanning speed of the laser light. Assume a case where it is intended to form a linear machining line by using the laser machining device disclosed in Patent Literature 1. In this case, if the deflector is simply driven to rotate at a constant speed, the laser light radiated from the deflector makes angular movement at a constant speed. Then, there arises a difference between the scanning speed of the laser light that falls from the vicinity of the peak of the arc and the scanning speed of the laser light that falls from a position away from the peak of the arc. If the laser light is scanned at such a non-constant speed, then in some parts of a single scribe line, size variation occurs among overlap margins. Such variation in size among overlap margins causes uneven machining.

The present invention has been made to solve the above-described problems. An object of the present invention is to make the scanning speed of the laser light as constant as possible while making the incidence angle of the laser light as perpendicular as possible and causing the laser light to focus on a scanning line as continuously as possible.

Solution to Problem

An optical scanning device according to the present invention includes: a projector configured to radiate laser light while causing the laser light to make angular movement around a projection center, and a reflector with a parabolic surface, the reflector being configured to reflect the laser light from the projector. The projection center is positioned at a focal point of the parabolic surface. The projector radiates the laser light while causing the laser light to make the angular movement at a non-constant speed, such that the greater a difference between a rotation angle of the laser light and a reference angle, the lower an angular speed of the laser light, the reference angle being the rotation angle of the laser light when the laser light reflects on a vertex of the parabolic surface.

Assuming that the laser light makes the angular movement at a constant speed, the scanning speed of the laser light is relatively low when the difference between the rotation angle of the laser light and the reference angle is small, whereas the scanning speed of the laser light is relatively high when the difference between the rotation angle of the laser light and the reference angle is great. In this manner, the scanning speed of the laser light changes in accordance with the rotation angle of the laser light.

On the other hand, according to the above-described configuration, the laser light makes the angular movement at a non-constant speed. In addition, the greater the difference between the rotation angle of the laser light and the reference angle, the lower the angular speed of the laser light. Accordingly, changes in the scanning speed of the laser light can be made small. Therefore, the scanning speed of the laser light can be made as constant as possible. Moreover, since the projection center is positioned at the focal point of the parabolic surface, the incidence angle of the laser light can be made perpendicular regardless of the rotation angle of the laser light, and also, the length of an optical path from the projection center to a scanning line can be kept constant regardless of the rotation angle of the laser light. Furthermore, since the production of the parabolic surface is relatively easy, an increase in the production cost of the optical scanning device can be suppressed.

The projector may include a multifaceted rotating mirror with a plurality of reflecting surfaces. A single scanning line may be formed while the laser light that is incident on the multifaceted rotating mirror is passing across one of the plurality of reflecting surfaces. A rotation angle of the multifaceted rotating mirror may pass the reference angle while the single scanning line is being formed.

According to the above configuration, by rotating the multifaceted rotating mirror (polygon mirror) in a single direction while changing the angular speed of the laser light, the laser light can be scanned along a plurality of scanning lines.

When the rotation angle of the laser light is the reference angle, the laser light may be incident on a middle point of any one of the plurality of reflecting surfaces.

The above configuration makes it possible to allow the angular speed of the laser light to continue to be the same when the laser light passes across a ridge where adjoining reflecting surfaces are connected to each other.

The projector may radiate the laser light while causing the laser light to make the angular movement at a non-constant speed in such a manner as to satisfy $\omega=V_x/a \{1+(V_x \times t/2a)^2\}$ in a case where: a distance between the focal point and the vertex is a; a scanning speed of the laser light is $V_x$; a time that has elapsed from a point when the rotation angle of the laser light is the reference angle is t; and the angular speed of the laser light is $\omega$.

According to the above configuration, the laser light can be caused to make linear movement at a constant speed. It should be noted that the value of the time t, which is a time elapsed from a point when the rotation angle of the laser light is the reference angle, may be a positive value, zero, or a negative value. In a case where t is a negative value, t represents a time necessary for the rotation angle of the laser light to become the reference angle.

A laser machining device according to the present invention includes the above-described optical scanning device. The laser machining device is configured to cause the laser light from the reflector to fall on a workpiece to form a machining line in the workpiece.

According to the above configuration, the scanning speed of the laser light on the workpiece can be made as constant as possible; the incidence angle of the laser light on the workpiece can be made perpendicular regardless of the rotation angle of the laser light; and the length of an optical path from the projection center to the workpiece can be kept constant regardless of the rotation angle of the laser light. This makes it possible to improve the machining efficiency while suppressing unevenness in the machining.

The laser machining device may include a conveying apparatus configured to convey the workpiece in a conveyance direction at a constant conveyance speed. The parabolic surface may be disposed in such a manner as to extend in a direction crossing the conveyance direction. The projector may be operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

According to the above configuration, the machining lines can be formed while conveying the workpiece. This makes it possible to reduce the takt time.

Advantageous Effects of Invention

The present invention makes it possible to make the scanning speed of the laser light on the workpiece as constant as possible while making the incidence angle of the laser light on the workpiece as perpendicular as possible and causing the laser light to focus on the workpiece as continuously as possible.

DESCRIPTION OF EMBODIMENTS

Figure 1:
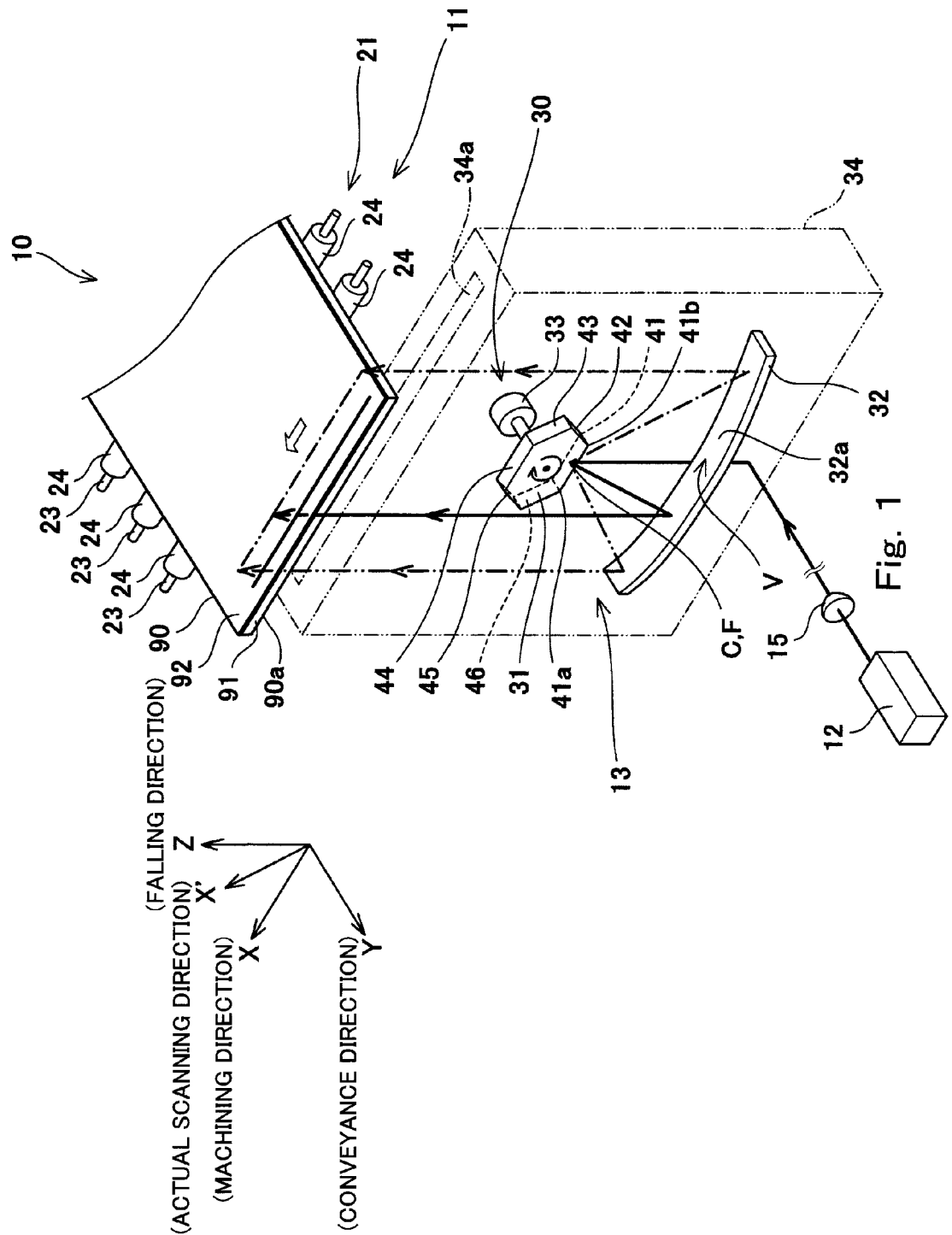
FIG. 1 is a perspective view conceptually showing the configuration of a laser machining device according to one embodiment of the present invention.

Hereinafter, one embodiment of the present invention will be described with reference to the accompanying drawings. In the drawings, the same or corresponding elements are denoted by the same reference signs, and repeating the same detailed descriptions is avoided.

(Description of Schematic Configuration of Laser Machining Device)

FIG. 1 is a perspective view conceptually showing the configuration of a laser machining device 10 according to one embodiment of the present invention. For example, the laser machining device 10 according to the present embodiment is suitably utilized in a patterning process performed in a factory producing thin-film solar cells. In the case of utilizing the laser machining device 10 in a patterning process, a plate-shaped or film-shaped member including a substrate 91 is applied as a workpiece 90. One surface of the substrate 91 has a thin-film layer 92 formed thereon. Laser light is incident on a surface of the workpiece 90, the surface being the opposite surface to the surface of the thin-film layer 92. (Hereinafter, the surface on which the laser light is incident is referred to as an "incidence surface 90a".) The thin-film layer 92 includes, for example, a transparent electrode layer directly formed on the one surface of the substrate 91 and a photoelectric conversion layer formed on the surface of the transparent electrode layer.

The laser machining device 10 according to the present embodiment conveys the workpiece 90 at a constant speed in a direction Y in a plane parallel to the incidence surface 90a. (Hereinafter the direction Y is referred to as a "conveyance direction Y".) At the same time, the laser machining device 10 emits laser light in a direction Z perpendicular to the incidence surface 90a (hereinafter, the direction Z is referred to as a "falling direction Z") to linearly scan the laser light on the workpiece 90. Accordingly, the laser light is transmitted through the substrate 91, and the surface layer of the thin-film layer 92 is removed at a portion that is irradiated with the laser light. As a result, a straight groove 93 (hereinafter, a "scribe line 93") is formed in the thin-film layer 92. The scanning of the laser light is performed a plurality of times, during which the position of the laser light in the conveyance direction Y is changed. Consequently, a plurality of scribe lines 93 are formed in the single workpiece 90. The plurality of scribe lines 93 thus formed are arranged in parallel to each other at regular intervals in the conveyance direction Y, and extend in a direction X perpendicular to the conveyance direction Y. (Hereinafter, the direction X is referred to as a "machining direction X".)

In the present embodiment, the workpiece 90 is conveyed in such an orientation that the incidence surface 90a extends horizontally. Accordingly, the machining direction X and the conveyance direction Y are horizontal, and the falling direction Z is vertical. In the description below, it is assumed that the workpiece 90 is in such an orientation. However, this orientation of the workpiece 90 is merely an example, and may be suitably changed.

As shown in FIG. 1, the laser machining device 10 according to the present embodiment mainly includes a conveying apparatus 11, a laser oscillator 12, and a laser scanning head 13.

Figure 2:
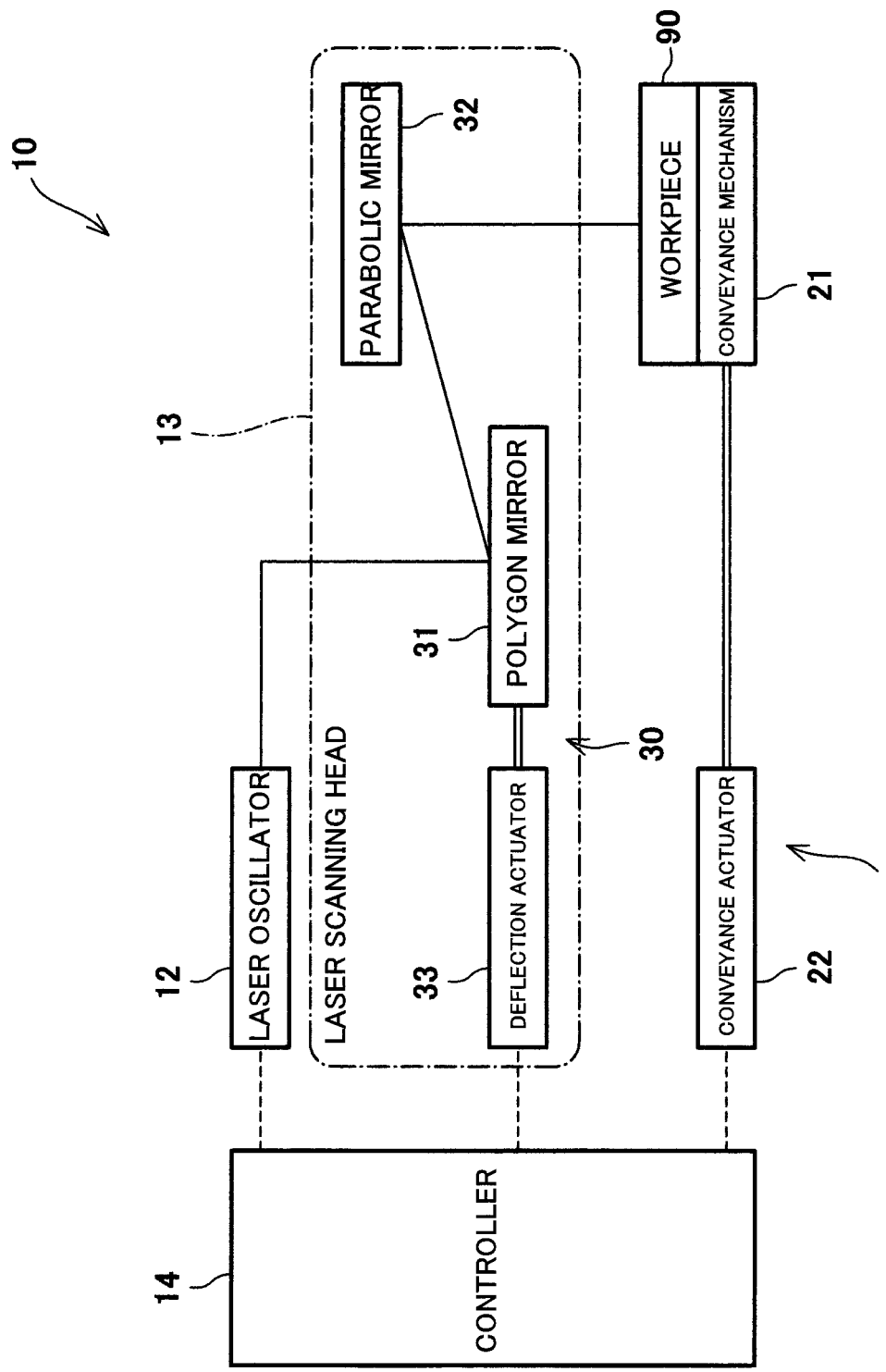
FIG. 2 is a block diagram schematically showing the configuration of the laser machining device of FIG. 1.

The conveying apparatus 11 includes: a conveyance mechanism 21 configured to support and convey the workpiece 90 in the conveyance direction Y; and a conveyance actuator 22 configured to drive the conveyance mechanism 21 (see FIG. 2). For example, the conveyance mechanism 21 includes: a plurality of rotating shafts 23 extending in the machining direction X and arranged side by side in the conveyance direction Y; and rollers 24 provided on the respective rotating shafts 23 and configured to rotate together with the respective rotating shafts 23. The workpiece 90 is placed on the circumferential surfaces of the rollers 24 in such an orientation that the incidence surface 90a faces downward and the thin-film layer 92 faces upward. For example, the conveyance actuator 22 is an electric motor, and drives the plurality of rotating shafts 23 to rotate in synchronization with each other. As a result, the workpiece 90 on the rollers 24 is conveyed in the conveyance direction Y.

The laser oscillator 12 oscillates a pulse laser at a pulse width in the range of milliseconds to microseconds (i.e. at a frequency in the range of kHz to MHz) to emit laser light toward the laser scanning head 13. It should be noted that the laser light may be emitted from a solid-state laser, a liquid laser, or a gas laser. A lens 15 is provided on an optical path extending from the laser oscillator 12 to the incidence surface 90a so as to allow the laser light to focus at the thin-film layer 92. FIG. 1 shows an example where the lens 15 is provided between the laser oscillator 12 and the laser scanning head 13. However, the position of the lens 15 is not particularly limited.

The laser scanning head 13 deflects the laser light from the laser oscillator 12 to irradiate the workpiece 90 with the laser light, thereby scanning the laser light along a scanning line that linearly extends on or in the workpiece 90. In the present embodiment, the laser scanning head 13 is disposed below the conveyance mechanism 21, and the falling direction Z of the laser light is the upward vertical direction. The laser light from below is directed upward in a manner to avoid the rotating shafts 23, and is incident on the incidence surface 90a from below.

The laser scanning head 13 includes: a radiating unit 30 configured to radiate the laser light while causing the laser light to make angular movement around a projection center C; and a reflector with a parabolic surface, the reflector being configured to reflect the laser light from the radiating unit 30 such that the laser light falls on the workpiece 90. To be more specific, as elements forming a laser light scanning optical system, the laser scanning head 13 includes: a polygon mirror 31 configured to cause laser light incident thereon to make angular movement around the projection center C; and a parabolic mirror 32 configured to reflect the laser light from the polygon mirror 31. The laser light reflected by the parabolic mirror 32 passes through an upward optical path extending in the falling direction Z, and is perpendicularly incident on the incidence surface 90a from below. The laser scanning head 13 further includes: a deflection actuator 33 configured to drive the polygon mirror 31 to rotate; and a casing 34 housing the polygon mirror 31 and the parabolic mirror 32. The polygon mirror 31 and the deflection actuator 33 form the projector 30, and the parabolic mirror 32 serves as the reflector.

The polygon mirror 31 has an external shape of a regular polygonal prism, and is configured such that a plurality of reflecting mirror surfaces 41 to 46 are formed on the respective sides of the polygon mirror 31. FIG. 1 shows an example where the polygon mirror 31 has the six reflecting mirror surfaces 41 to 46, and the reflecting mirror surfaces 41 to 46 form a regular hexagon when seen in the direction of the central axis of the polygon mirror 31. However, the number of reflecting mirror surfaces of the polygon mirror 31 is not limited to six. The deflection actuator 33 is an electric motor, for example, and drives the polygon mirror 31 to rotate around the central axis of the polygon mirror 31.

The laser light from the laser oscillator 12 is directed to be in the positive falling direction Z (the upward vertical direction) inside the casing 34, and then incident on the polygon mirror 31 from below. While the incident laser light is passing across one of the reflecting mirror surfaces, the polygon mirror 31 rotates by 360/N [deg] (N: the number of reflecting mirror surfaces). "While the laser light is passing across one of the reflecting mirror surfaces" herein means a period from a point when the laser light is incident on a start-point ridge (e.g., a ridge 41a), which is formed by the one reflecting mirror surface (e.g., a surface 41) and a reflecting mirror surface (e.g., a surface 46) continuous with the one reflecting mirror surface at the positive mirror-rotating direction side, to a point when the laser light is incident on an end-point ridge (e.g., a ridge 41b), which is formed by the one reflecting mirror surface (e.g., the surface 41) and a reflecting mirror surface (e.g., a surface 42) continuous with the one reflecting mirror surface at the negative mirror-rotating direction side, i.e., a period over which the laser light reflects on the one reflecting mirror surface (e.g., the surface 41). Over the period, the laser light reflects on the one reflecting mirror surface, which is rotating, and makes angular movement by a rotational angular range of 360×2/N [deg] around the projection center C positioned on the one reflecting mirror surface (N: the number of reflecting mirror surfaces). When the laser light has passed across the one reflecting mirror surface (e.g., the surface 41), the laser light starts passing across the reflecting mirror surface (e.g., the surface 42) continuous with the one reflecting mirror surface (e.g., the surface 41) at the negative mirror-rotating direction side. Accordingly, a ridge formed by two adjoining reflecting mirror surfaces (e.g., the ridge 41b) serves as the end-point ridge for the reflecting mirror surface (e.g., the surface 41) positioned at the positive mirror-rotating direction side, and serves as the start-point ridge for the reflecting mirror surface (e.g., the surface 42) positioned at the negative mirror-rotating direction side.

The parabolic mirror 32 has a reflecting mirror surface 32a, which forms a parabola when seen in the direction of the central axis of the polygon mirror 31. Although the parabolic mirror 32 serving as the reflector has the reflecting mirror surface 32a, which is a parabolic surface, the "parabolic surface" herein is not a paraboloid of revolution but a surface whose sectional shape is a parabola. The polygon mirror 31 and the parabolic mirror 32 are arranged such that the projection center C is positioned at a focal point F of the parabolic surface (more specifically, the focal point of the parabola that is the sectional shape of the parabolic surface; hereinafter, the focal point is referred to as a "parabola focal point F"), and such that a straight line that connects a vertex V of the parabolic surface (more specifically, the vertex of the parabola that is the sectional shape of the parabolic surface; hereinafter the vertex is referred to as a "parabola vertex V") to the center C (i.e., the axis of symmetry of the parabola) extends in the falling direction Z.

Accordingly, if the projection center C is positioned at the middle point between the start-point ridge 41a and the end-point ridge 41b, the laser light is radiated from the projection center C in the negative falling direction Z (the downward vertical direction), and reflects on the reflecting mirror surface 32a of the parabolic mirror 32 at the parabola vertex V. If the projection center C is positioned away from the middle point toward the start-point ridge 41a, the laser light reflects on the reflecting mirror surface 32a at a position that is away from the parabola vertex V toward the upstream side of the machining direction X (i.e., toward the lower right of FIG. 1). If the projection center C is positioned away from the middle point toward the end-point ridge 41b, the laser light reflects on the reflecting mirror surface 32a at a position that is away from the parabola vertex V toward the downstream side of the machining direction X (i.e., toward the upper left of FIG. 1).

The laser light that has reflected on the parabolic mirror 32 is, regardless of the position of the reflection (i.e., regardless of the rotation angle of the polygon mirror 31), directed to be in the positive falling direction Z (the upward vertical direction), and then perpendicularly incident on the incidence surface 90a from below. Since the projection center C is positioned at the parabola focal point F, the length of an optical path from the projection center C to the incidence surface 90a is constant regardless of the position of the reflection on the parabolic mirror 32. It should be noted that the laser light passes through a slit 34a formed in the top surface of the casing 34. In this manner, the laser light is emitted from the inside of the casing 34 to the outside of the casing 34.

In the present embodiment, the irradiation position of the laser light when the projection center C is positioned at the start-point ridge 41a is a start point 93A of a scribe line 93, and the irradiation position of the laser light when the projection center C is positioned at the end-point ridge 41b is an end point 93B of the scribe line 93. While the laser light is passing across the one reflecting mirror surface, the single scribe line 93 connecting the start point 93A to the end point 93B is formed. The incidence of the laser light is perpendicular at any position on the scribe line 93, and this improves the machining efficiency. Since the length of the optical path of the laser light is the same at any position on the scribe line 93, the laser light continues to focus on the incidence surface 90a without requiring any means for changing the focal length of the laser light in accordance with the rotation angle of the polygon mirror 31.

FIG. 2 is a block diagram schematically showing the configuration of the laser machining device 10 of FIG. 1. It should be noted that, in FIG. 2, solid lines represent laser light; double lines represent mechanical connection; and dotted lines represent electrical connection. As shown in FIG. 2, the laser machining device 10 includes: the conveyance actuator 22; and a controller 14 configured to control the laser oscillator 12 and the deflection actuator 33. At the time of performing a patterning process, the controller 14 causes the conveyance actuator 22, the laser oscillator 12, and the deflection actuator 33 to operate at the same time. As a result, while the workpiece 90 is being conveyed in the conveyance direction Y, the laser light is scanned on the incidence surface 90a, and thereby a plurality of scribe lines 93 are formed in the workpiece 90.

The controller 14 controls the conveyance actuator 22 such that the workpiece 90 is conveyed at a constant conveyance speed (i.e., such that the rotating shafts 23 and the rollers 24 rotate at a constant angular speed corresponding to the conveyance speed). The controller 14 controls the laser oscillator 12 such that the pulse laser is oscillated at a constant frequency. The controller 14 controls the deflection actuator 33 such that the laser light is scanned on or in the workpiece 90 at a constant scanning speed. In order to realize such constant-speed scanning, the controller 14 controls the deflection actuator 33 such that the angular speed of the laser light (which has a correspondence relationship with the angular speed of the polygon mirror 31) changes in accordance with the rotation angle of the laser light (which has a correspondence relationship with the rotation angle of the polygon mirror 31).

(Relationship Between Machining Direction and Actual Scanning Direction)

Figure 3:
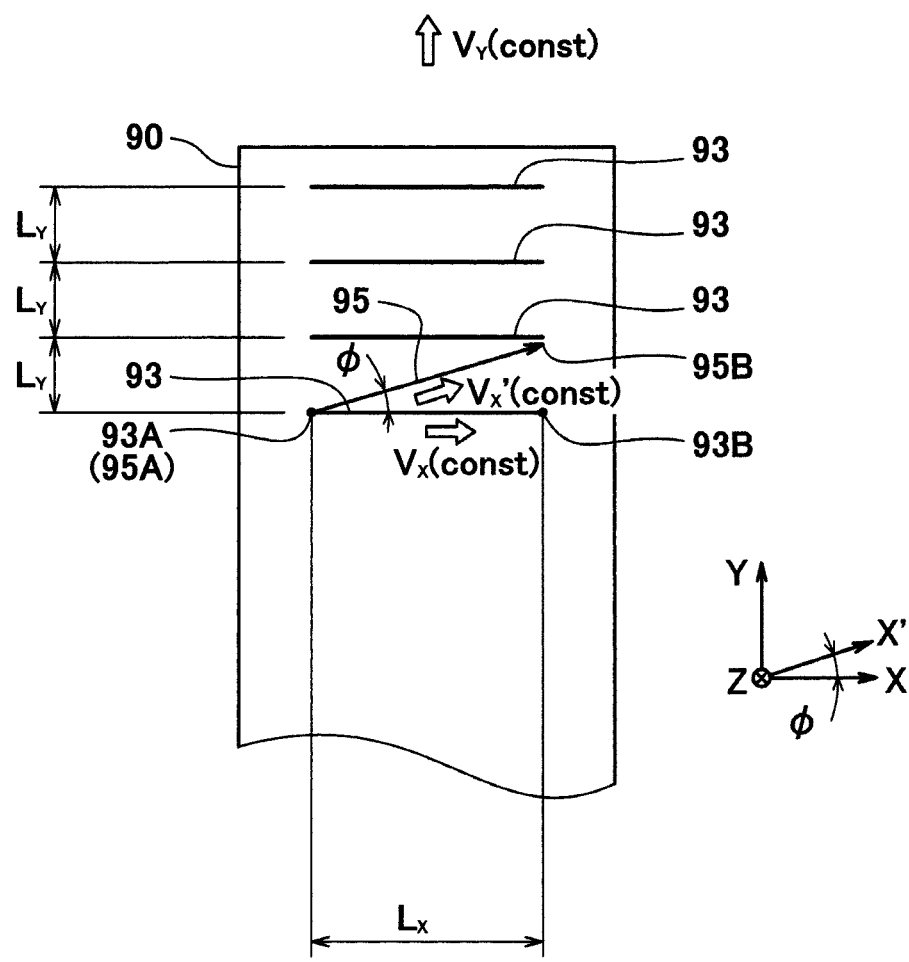
FIG. 3 is a conceptual diagram showing a relationship among a conveyance direction Y of a workpiece, a machining direction X of a scribe line, and an actual scanning direction X' of laser light.

FIG. 3 is a conceptual diagram showing a relationship among the conveyance direction Y of the workpiece 90, the machining direction X of a scribe line 93, and a direction X' in which the laser light is actually scanned. (Hereinafter, the direction X' is referred to as either an actual scanning direction X' or a ground scanning direction X'.) In the present embodiment, the laser machining device 10 irradiates the incidence surface 90a with the laser light while conveying the workpiece 90 in the conveyance direction Y at a constant conveyance speed $V_Y$, thereby forming a scribe line 93 extending in the machining direction X in the workpiece 90. Therefore, in order for the laser light to be scanned in the machining direction X when seen from the conveyed workpiece 90, the laser light scanning needs to be performed such that the laser light is, when seen from the ground on which the casing 34 is set, scanned in the actual scanning direction X', which is inclined relative to both the conveyance direction Y and the machining direction X in a plane parallel to the incidence surface 90a. It should be noted that the falling direction Z is the same direction (e.g., the vertical direction) whether the falling direction Z is seen from the workpiece 90 or seen from the ground. Accordingly, the orientation of the XY plane (i.e., the plane parallel to the incidence surface 90a) is the same orientation (e.g., horizontal) whether the XY plane is seen from the workpiece 90 or seen from the ground.

In order to scan the laser light in such a manner, the polygon mirror 31 (see FIG. 1) is disposed such that its central axis is in a direction perpendicular to the actual scanning direction X'. The parabolic mirror 32 (see FIG. 1) is disposed in such a manner as to extend in the actual scanning direction X'.

In the description below, the scanning path of the laser light in the XY plane when seen from the ground is referred to as an "actual scanning line 95". In the XY plane, the actual scanning line 95 and the scribe line 93 form an inclination angle φ, and the actual scanning line 95 extends from the start point 93A of the scribe line 93 in the actual scanning direction X' such that the actual scanning line 95 is inclined toward the downstream side of the conveyance direction Y. In the present embodiment, not only the conveyance speed $V_Y$, but also a scanning speed $V_X$ of the laser light in the machining direction X is constant. Therefore, the scanning speed of the laser light on the actual scanning line 95 (hereinafter, referred to as either an actual scanning speed $V_X'$ or a ground scanning speed $V_X'$) is also constant. Accordingly, the sine of the inclination angle φ is represented by using an equation (1) below.

[Math. 1]

$$\sin \phi = V_Y/V_{X'} \tag{1}$$

If the equation (1) is satisfied, then a scribe line 93 extending in the machining direction X (perpendicular to the conveyance direction Y) can be formed in the workpiece 90 at a constant speed by scanning the laser light in the actual scanning direction X' at a constant speed while conveying the workpiece 90 in the conveyance direction Y at a constant speed.

In the present embodiment, while the laser light is passing across one of the reflecting mirror surfaces of the polygon mirror 31, a scribe line 93 connecting the start point 93A to the end point 93B is formed in the conveyed workpiece 90. While the laser light is passing across the one reflecting mirror surface, the laser light seen from the ground is scanned along the actual scanning line 95 extending in the actual scanning direction X' from a start point 95A to an end point 95B of the actual scanning line 95.

In this case, the end-point ridge of the one reflecting mirror surface is the same ridge as the start-point ridge of the immediately adjacent reflecting mirror surface at the negative mirror-rotating direction side. Accordingly, at the same time as the laser light has passed across the one reflecting mirror surface to reach the end point 95B of the actual scanning line 95, the laser light returns to the start point 95A of the actual scanning line 95 to start passing across the next reflecting mirror surface. The start point 95A of the actual scanning line 95 that corresponds to the newly started scanning coincides with the start point 93A of the scribe line 93 that corresponds to the newly started scanning. The start point 95A of the actual scanning line 95 that corresponds to the newly started scanning is away, in the conveyance direction Y by a distance $L_Y$, from the start point 93A of the scribe line 93 that corresponds to the previous scanning. The distance $L_Y$ is a distance in the conveyance direction Y between two adjoining scribe lines 93. (Hereinafter, the distance $L_Y$ is referred to as a "scribe distance $L_Y$".) The scribe distance $L_Y$ is equal to the conveyance distance of the workpiece 90 from when a single scanning is started to when the single scanning is ended. The conveyance distance is equal to a distance in the XY plane from the end point 93B of the scribe line 93 to the end point 95B of the actual scanning line 95. Accordingly, if the length of the scribe line 93 in the machining direction X (corresponding to the length of the scanning line in the scanning direction as seen from the conveyed workpiece 90; hereinafter referred as to a "scribe length") is $L_X$, then the tangent of the inclination angle φ is represented by using an equation (2) below.

[Math. 2]

$$\tan \phi = L_Y/L_X \tag{2}$$

The scribe length $L_X$ and the scribe distance $L_Y$ can be set at a relatively early stage in accordance with product specifications, and the inclination angle φ can be set in accordance with the scribe length $L_X$ and the scribe distance $L_Y$ by using the equation (2). The conveyance speed $V_Y$ and the actual scanning speed $V_X'$ are set to suitable values in accordance with the inclination angle φ so as to satisfy the equation (1). It should be noted that the scanning speed $V_X$ is represented by an equation (3) below by using the cosine of the inclination angle φ.

[Math. 3]

$$V_X = V_{X'} \cos \phi \tag{3}$$

As described above, in the present embodiment, the actual scanning direction X' of the laser light is inclined relative to both the machining direction X and the conveyance direction Y. Accordingly, while continuously conveying the workpiece 90 and continuously rotating the polygon mirror 31 (i.e., continuously operating the projector 30), a plurality of scribe lines 93 can be formed such that they are arranged side by side and spaced apart from each other in the conveyance direction Y. That is, the plurality of scribe lines 93 can be formed without performing such control as to repeat start-up and stop of the conveyance actuator 22 and the deflection actuator 33. Consequently, improvement is made in terms of the takt time of the patterning process.

It should be noted that since pulse laser light is applied as the laser light, the scanning speed $V_X$ and the actual scanning speed $V_X'$ of the laser light are set such that overlap margins are formed. Thus, the scanning speed $V_X$ and the actual scanning speed $V_X'$ are set to suitable values by taking account of not only the scribe length $L_X$, the scribe distance $L_Y$, the inclination angle φ, and the conveyance speed $V_Y$ but also the frequency of the pulse laser and the size of the laser light on the workpiece 90 in order to improve the takt time and assure the continuity of the scribe line 93.

(Arrangement of Laser Scanning Head)

Figure 4:
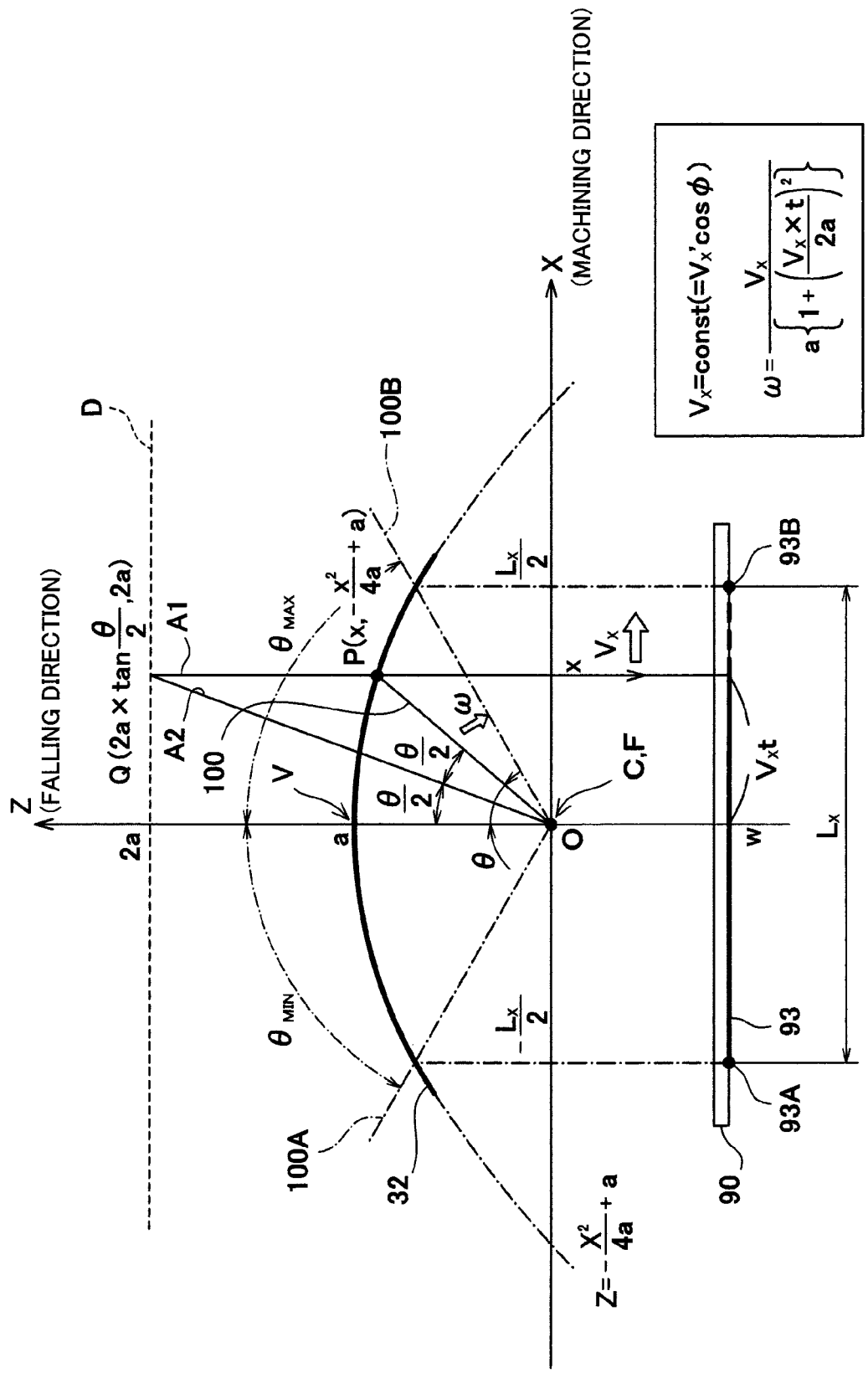
FIG. 4 is a conceptual diagram showing a laser scanning head in a two-dimensional orthogonal coordinate system, in which the horizontal axis represents the machining direction X of the scribe line and the vertical axis represents a falling direction Z of laser light, the conceptual diagram showing a positional relationship between a parabolic mirror and a projection center of a polygon mirror, and also showing a relationship among the position of the laser light in the machining direction X, the scanning speed of the laser light in the machining direction X, the rotation angle of the polygon mirror, and the angular speed of the polygon mirror.

FIG. 4 is a conceptual diagram showing a positional relationship between the parabolic mirror 32 and the projection center C, and also showing a relationship among the position of the laser light in the machining direction X, the scanning speed $V_X$ of the laser light in the machining direction X, a rotation angle θ of the laser light, and an angular speed ω of the laser light. It should be noted that, in FIG. 4, for the sake of convenience of the description, a two-dimensional orthogonal coordinate system (i.e., a workpiece coordinate system) is used, in which the horizontal axis represents the machining direction X of a scribe line 93 (i.e., the scanning direction of the laser light as seen from the conveyed workpiece 90), and the vertical axis represents the falling direction Z of the laser light.

As shown in FIG. 4, it is assumed here that the scribe line 93 is represented as a straight line of Z=w (w<0), which is parallel to the horizontal axis, and that the parabolic mirror 32 is convex upward. That is, the negative falling direction Z side (the vertically lower side) is shown as the upper side in the vertical axis direction, and the positive falling direction Z side (the vertically upper side) is shown as the lower side in the vertical axis direction. It is also assumed that the projection center C and the parabola focal point F are positioned at an origin O, and that the axis of symmetry of the parabola is positioned on the vertical axis. If the distance between the focal point F and the vertex V is a, then the vertex V can be represented as coordinates (0, a); a directrix D can be represented as a straight line of Z=2a; and the parabola can be represented as a curve of $Z=-X^2/4a+a$ (a>0).

Since the middle point between the start point 93A and the end point 93B of the scribe line 93 is positioned on the vertical axis, the coordinates of the start point 93A can be represented as $(-L_X/2, w)$, and the coordinates of the end point 93B can be represented as $(L_X/2, w)$ ($L_X>0$).

In a case where the projection center C is positioned at the middle point between the start-point ridge and the end-point ridge of one reflecting mirror surface, the laser light from the projection center C toward the parabolic mirror 32 passes through an optical path on the vertical axis. In the description below, the rotation angle of the laser light at the time is 0 [deg], which is hereinafter referred to as a reference angle. The rotation angle of the polygon mirror 31 when the rotation angle of the laser light is the reference angle is also referred to as a reference angle. In the present embodiment, the number of reflecting mirror surfaces of the polygon mirror 31 is six. Therefore, while the polygon mirror 31 fully rotates once, the reference angle appears every 60 degrees, i.e., there are six reference angles.

If the rotation angle of the laser light is the reference angle, the laser light reflects on the vertex V, passes through an optical path on the vertical axis to be perpendicularly incident on the incidence surface 90a, thereby irradiating the middle point between the start point 93A and the end point 93B on the scribe line 93.

In a case where the rotational center C is positioned at the end-point ridge, the rotation angle of the laser light is a maximum angle $\theta_{MAX}$, which is the half value of the rotational angular range, i.e., satisfies the following equation: $\theta_{MAX}[deg]=(360\times2/N)/2=360/N$ ($\theta_{MAX}>0$ and N represents the number of reflecting mirror surfaces). In this case, an optical path 100B of the laser light from the projection center C toward the parabolic mirror 32 is represented as a straight line passing through the origin O and rising to the right (inclination: $\tan(90-\theta_{MAX})$), and the angle formed by the vertical axis and the straight line is the maximum angle $\theta_{MAX}$. The laser light, after reflecting on an intersection point, passes through an optical path parallel to the vertical axis, and is then perpendicularly incident on the incidence surface 90a to irradiate the end point 93B of the scribe line 93. Accordingly, the X coordinate of the intersection point between the optical path 100B and the parabola is $(L_X/2)$, which is the same as the X coordinate of the end point 93B of the scribe line 93.

In a case where the rotational center C is positioned at the start-point ridge, the same as above occurs in relation to the vertical axis but in an axisymmetrical manner. Specifically, the rotation angle of the laser light is a negative minimum angle $\theta_{MIN}$, whose absolute value is equal to the maximum angle $\theta_{MAX}$ ($\theta_{MIN}=-\theta_{MAX}$). An optical path 100A of the laser light from the rotational center C toward the parabolic mirror 32 is represented as a straight line passing through the origin O and falling to the right (inclination: $\tan(90-\theta_{MIN})$). The laser light, after reflecting on an intersection point between the optical path 100A and the parabola, passes through an optical path parallel to the vertical axis, and is then perpendicularly incident on the incidence surface 90a to irradiate the start point 93A of the scribe line 93.

Assume that the polygon mirror 31 is rotating at a constant speed, and the optical path extending from the rotational center C is making angular movement at a constant speed. In this case, the greater the difference between the rotation angle of the laser light and its reference angle (i.e., the greater the difference between the rotation angle of the polygon mirror 31 and its reference angle), the higher the scanning speed of the laser light on the workpiece 90 in the machining direction X. Accordingly, so long as the frequency of the pulse laser is constant, the closer to the start point 93A of the scribe line 93 or the closer to the end point 93B of the scribe line 93, the less the overlap margin. If the size of the overlap margin thus varies, then a gradient in the amount of removal of the thin-film layer 92 at the time of formation of the scribe line 93 occurs in the machining direction X. The gradient results in uneven machining.

In view of the above, in the present embodiment, the controller 14 controls the deflection actuator 33 such that the greater the difference between the rotation angle of the laser light and its reference angle, the lower the angular speed of the laser light. In other words, the deflection actuator 33 drives the polygon mirror 31 to rotate at a non-constant speed, such that the greater the difference between the rotation angle of the polygon mirror 31 and its reference angle, the lower the angular speed of the polygon mirror 31. In this manner, changes in the scanning speed that occur in a case where the polygon mirror 31 is rotating at a constant speed can be reduced, and thus unevenness in the machining can be suppressed.

(Angular Speed of Laser Light)

Next, how the angular speed ω of the laser light should be set in order to make the scanning speed $V_X$ of the laser light constant is described with reference to FIG. 4. In the description below, a time that elapses from a point when the rotation angle of the laser light is the reference angle to a point when the rotation angle of the laser light becomes an arbitrary angle θ is referred to as an elapsed time t. It is assumed that when the rotation angle of the laser light is the angle θ, the X coordinate of an intersection point P between the parabola and an optical path 100 of the laser light from the projection center C toward the parabolic mirror 32 is x.

FIG. 4 shows an example where the arbitrary angle θ is a positive value. Accordingly, in this case, the elapsed time t is also a positive value. However, in other cases, the value of the elapsed time t may be zero or a negative value. For example, in a case where the laser light is incident on a position that is away from the middle point between the start-point ridge and the end-point ridge to the start-point ridge side and the rotation angle of the laser light has not yet reached the reference angle, the elapsed time t may be a negative value, which may be regarded as a time necessary for the rotation angle of the laser light to reach the reference angle.

If a perpendicular A1 is drawn from the aforementioned intersection point P to the directrix D, and a straight line A2 connecting an intersection point Q between the directrix D and the perpendicular A1 to the origin O is drawn, then based on the definition of parabola, the straight line A2 is the bisector of the angle θ. Since the directrix D can be represented as a straight line of Z=2a as mentioned above, the X coordinate of the point Q is represented as $2a\times\tan(\theta/2)$. Since the point Q is on the perpendicular A1 passing through the point P, the X coordinate x of the point P is equal to the X coordinate of the point Q as represented in an equation (4) below. It should be noted that the inverse function of the equation (4) is represented by an equation (5) below.

[Math. 4]

$$x = 2a\tan\frac{\theta}{2} \tag{4}$$

[Math. 5]

$$\theta = \tan^{-1}\frac{x}{2a} \tag{5}$$

The angle θ changes in accordance with the elapsed time t. For this reason, the X coordinate x of the point P also changes in accordance with the elapsed time t. Accordingly, the angular speed ω of the laser light can be obtained by first-order differentiation of the angle θ. Therefore, based on the equation (5), the angular speed ω can be represented by an equation (6) below.

[Math. 6]

$$\omega = \frac{d\theta}{dt} \quad (6)$$
$$= 2\frac{1}{1+\left(\frac{x}{2a}\right)^2}\frac{d}{dt}\left(\frac{x}{2a}\right)$$
$$= 2\frac{1}{1+\left(\frac{x}{2a}\right)^2}\frac{1}{2a}\frac{dx}{dt}$$

The laser light, after reflecting on the point P, passes through an optical path parallel to the vertical axis, and is then incident on the incidence surface 90a. Therefore, the X coordinate of the irradiation position of the laser light is equal to the X coordinate x of the point P. The X coordinate of the irradiation position also corresponds to a distance by which the laser light has moved on the workpiece 90 in the machining direction X during the elapse of the time t. In the present embodiment, since the scanning speed $V_X$ of the laser light is constant, x can be represented by an equation (7) below, and $V_X$ can be represented by an equation (8) below.

[Math. 7]

$$x = V_X \times t \quad (7)$$

[Math. 8]

$$V_X = \frac{dx}{dt}(= const) \quad (8)$$

Based on the equations (6) to (8), the angular speed ω of the laser light can be represented by an equation (9) below.

[Math. 9]

$$\omega = \frac{V_X}{a\left\{1+\left(\frac{V_X \times t}{2a}\right)^2\right\}} \quad (9)$$

In the equation (9), a and $V_X$ are constants. Accordingly, the angular speed ω of the laser light only depends on the elapsed time t, and changes in accordance with the rotation angle of the laser light. According to the equation (9), the greater the absolute value of the elapsed time t, that is, the greater the difference between the rotation angle of the laser light and its reference angle, i.e., the greater the difference between the rotation angle of the polygon mirror 31 and its reference angle, or the closer the projection center C is to a ridge, the lower the angular speed ω of the laser light.

Assume a case where when the rotation angle of the laser light is the reference angle, the rotation angle of the polygon mirror 31 is the reference angle of zero degrees. In this case, the rotation angle of the polygon mirror 31 is the half value of the rotation angle of the laser light. FIG. 4 shows a workpiece coordinate system for the sake of convenience of the description; however, when seen from the ground, the laser light is scanned in the actual scanning direction (ground scanning direction) X', which is inclined relative to the machining direction X by the inclination angle φ.

In view of this, when controlling the deflection actuator 33 by means of the controller 14, the equation (9) is modified by taking account of the correspondence relationship between the rotation angle of the polygon mirror 31 and the rotation angle of the laser light, the inclination angle φ formed by the machining direction X and the actual scanning direction X', etc., and thereby a relational expression between the angular speed of the polygon mirror 31 and the elapsed time t is derived. The controller 14 controls the deflection actuator 33 in accordance with the relational expression thus derived. For example, if the distance from the start point 93A of the scribe line 93 to a current position in the conveyance direction Y as seen from the ground is y, then the angular speed $\omega_A$ of the laser light at the current position as seen from the ground can be represented by an equation (10) below.

[Math 10]

$$\omega_A = \frac{V_Y/\tan\phi}{a\left\{1+\frac{(ABS(INT(y/L_Y)+1/2)*L_Y-y)/\tan\phi}{2a}\right\}} \quad (10)$$

(Operation of Laser Machining Device)

Figure 5:
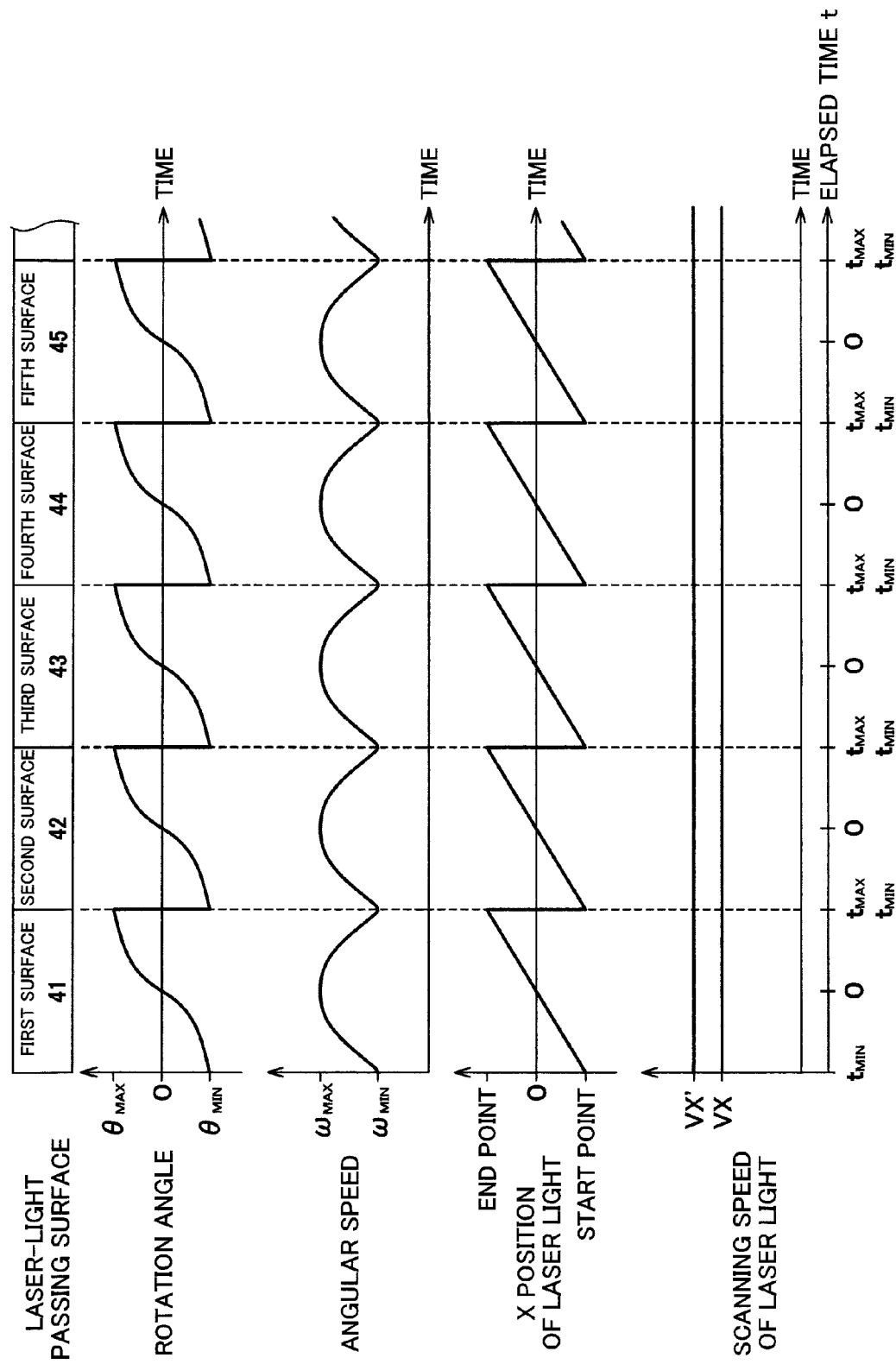
FIG. 5 is a timing diagram showing one example of the operation of the laser machining device of FIG. 1.

FIG. 5 is a timing diagram showing one example of the operation of the laser machining device 10 of FIG. 1. FIG. 5 shows, from top to bottom, the rotation angle of the laser light, the angular speed of the laser light, the position of the laser light on the workpiece 90 in the machining direction X (which may hereinafter be simply referred to as an "X position"), and temporal changes in the scanning speed of the laser light. It should be noted that the rotation angle of the polygon mirror 31 shows a tendency similar to that of the rotation angle of the laser light, and the angular speed of the polygon mirror 31 shows a tendency similar to that of the angular speed of the laser light. The uppermost part of FIG. 5 schematically shows, along a time axis, which reflecting mirror surface does the laser light incident on the polygon mirror 31 reflects on. The lowermost part of FIG. 5 schematically shows, along the time axis, a numerical value to be assigned to t in the equation (9).

When the laser light is incident on the start-point ridge of a first surface 41, the rotation angle of the laser light is the minimum angle $\theta_{MIN}$; the X position of the laser light is the start point 93A of the scribe line 93; the elapsed time t elapsed from a point when the rotation angle of the laser light is the reference angle is a minimum value $t_{MIN}$ ($t_{MIN}$<0); and the angular speed of the laser light is a minimum value toes, which is determined in accordance with the minimum value $t_{MIN}$. The angular speed of the laser light changes in a non-linear manner as time elapses according to the equation (9). Consequently, the rotation angle of the laser light also changes in a non-linear manner.

When the laser light is incident on the middle point between the start-point ridge and the end-point ridge, the rotation angle of the laser light is the reference angle (0 [deg]); the X position of the laser light is the middle point between the start point 93A and the end point 93B of the scribe line 93; the elapsed time t is 0; and the angular speed of the laser light is a maximum value $\omega_{MAX}$.

When the laser light is incident on the end-point ridge of the first surface 41, the rotation angle of the laser light is the maximum angle $\theta_{MAX}$, and the X position of the laser light is the end point 93B of the scribe line 93. In this manner, the formation of the single scribe line 93 is completed.

While the laser light is passing across the first surface 41, the angular speed $\omega$ of the laser light continues changing according to the equation (9). As a result, the scanning speed $V_X$ of the laser light remains constant, and the X position of the laser light changes in a linear manner. Therefore, even though the parabolic mirror 32 is used and the frequency of the pulse laser is kept constant, changes in the size of the overlap margin can be suppressed, which makes it possible to suppress unevenness in the machining. Moreover, the laser light is perpendicularly incident on the incidence surface 90a. Therefore, the machining efficiency is improved. Furthermore, the length of the optical path of the laser light from the projection center C to the incidence surface 90a is constant regardless of the rotation angle of the laser light. Therefore, the laser light can be caused to continuously focus at the thin-film layer 92 without making the focal length of the laser light variable.

The ridge formed by the first and second surfaces 41 and 42 serves as the end-point ridge for the first surface 41, and also serves as the start-point ridge for the second surface 42. Accordingly, when the laser light is incident on the ridge, the rotation angle of the laser light changes from the maximum angle $\theta_{MAX}$ to the minimum angle $\theta_{MIN}$, and the X position of the laser light changes from the end point 93B to the start point 93A. As described above, since the reference angle of the rotation angle of the laser light is set for each reflecting mirror surface of the polygon mirror 31, when the laser light is incident on a ridge, the elapsed time t is reset from its maximum value $t_{MAX}$ to the minimum value $t_{MIN}$. In the present embodiment, when the rotation angle of the laser light is the reference angle, the laser light is incident on the middle point between the start-point ridge and the end-point ridge. Accordingly, the absolute value of the minimum angle $\theta_{MIN}$ of the rotation angle of the laser light is equal to the maximum angle $\theta_{MAX}$, and the absolute value of the minimum value $t_{MIN}$ of the elapsed time t is equal to the maximum value $t_{MAX}$ ($t_{MIN}=-t_{MAX}$).

Accordingly, the angular speed of the laser light obtained by assigning $t_{MAX}$ to t in the equation (9) is equal to the angular speed obtained by assigning $t_{MIN}$ to t, and the value of the angular speed is the minimum value $\omega_{MIN}$. Therefore, when the laser light passes across a ridge, the angular speed continues to be the minimum value $\omega_{MIN}$. This makes it possible to form a plurality of scribe lines 93 while causing the polygon mirror 31 to rotate continuously.

Although the embodiment of the present invention has been described above, the above-described configuration is merely an example, and may be suitably changed without departing from the scope of the present invention. For example, in the above-described embodiment, one scanning line or scribe line is formed by fully using a reflecting mirror surface. However, it is not essential for the ridges of the polygon mirror to correspond to the start and end points of the scanning line or scribe line. "Forming a machining line while the laser light is passing across one of the reflecting mirror surfaces" herein is not limited to the case of forming the machining line by fully using the reflecting mirror surface, but includes the case of forming the machining line by using part of the reflecting mirror surface in such a manner as not to perform the machining line formation when the laser light is incident on a ridge. The laser machining device according to the present invention can be suitably utilized not only in the patterning process of solar cells, but in other uses in which the laser light is used to form one or a plurality of machining lines in a workpiece.

INDUSTRIAL APPLICABILITY

The present invention provides functional advantages of being able to make the scanning speed of the laser light as constant as possible while making the incidence angle of the laser light as perpendicular as possible and causing the laser light to focus as continuously as possible. The present invention is useful when applied to a laser machining device that is configured to form a machining line in a workpiece with laser light.

The invention claimed is:

1. An optical scanning device comprising:
   a projector configured to radiate laser light while causing the laser light to make angular movement around a projection center; and
   a reflector with a parabolic surface, the reflector being configured to reflect the laser light from the projector, wherein
   the projection center is positioned at a focal point of the parabolic surface, and
   the projector radiates the laser light while causing the laser light to make the angular movement at a non-constant speed, such that the greater a difference between a rotation angle of the laser light and a reference angle, the lower an angular speed of the laser light, the reference angle being the rotation angle of the laser light when the laser light reflects on a vertex of the parabolic surface.

2. The optical scanning device according to claim 1, wherein
   the projector includes a multifaceted rotating mirror with a plurality of reflecting surfaces,
   a single scanning line is formed while the laser light that is incident on the multifaceted rotating mirror is passing across one of the plurality of reflecting surfaces, and
   a rotation angle of the multifaceted rotating mirror passes the reference angle while the single scanning line is being formed.

3. The optical scanning device according to claim 2, wherein when the rotation angle of the laser light is the reference angle, the laser light is incident on a middle point of any one of the plurality of reflecting surfaces.

4. The optical scanning device according to claim 1, wherein
   the projector radiates the laser light while causing the laser light to make the angular movement in such a manner as to satisfy $\omega=V_x/a \{1+(V_x \times t/2a)^2\}$ in a case where:
   a distance between the focal point and the vertex is a;
   a scanning speed of the laser light is $V_x$;
   a time that has elapsed from a point when the rotation angle of the laser light is the reference angle is t; and
   the angular speed of the laser light is $\omega$.

5. A laser machining device comprising the optical scanning device according to claim 1, wherein
   the laser machining device is configured to cause the laser light from the reflector to fall on a workpiece to form a machining line in the workpiece.

6. The laser machining device according to claim 5, comprising a conveying apparatus configured to convey the workpiece in a conveyance direction at a constant conveyance speed, wherein the parabolic surface is disposed in such a manner as to extend in a direction crossing the conveyance direction, and the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

7. The optical scanning device according to claim 2, wherein
the projector radiates the laser light while causing the laser light to make the angular movement in such a manner as to satisfy $\omega = V_x/a \{1+(V_x t/2a)^2\}$ in a case where:
a distance between the focal point and the vertex is a;
a scanning speed of the laser light is $V_x$;
a time that has elapsed from a point when the rotation angle of the laser light is the reference angle is t; and
the angular speed of the laser light is $\omega$.

8. The optical scanning device according to claim 3, wherein
the projector radiates the laser light while causing the laser light to make the angular movement in such a manner as to satisfy $\omega = V_x/a \{1+(V_x t/2a)^2\}$ in a case where:
a distance between the focal point and the vertex is a;
a scanning speed of the laser light is $V_x$;
a time that has elapsed from a point when the rotation angle of the laser light is the reference angle is t; and
the angular speed of the laser light is $\omega$.

9. A laser machining device comprising the optical scanning device according to claim 2, wherein
the laser machining device is configured to cause the laser light from the reflector to fall on a workpiece to form a machining line in the workpiece.

10. A laser machining device comprising the optical scanning device according to claim 3, wherein
the laser machining device is configured to cause the laser light from the reflector to fall on a workpiece to form a machining line in the workpiece.

11. A laser machining device comprising the optical scanning device according to claim 4, wherein
the laser machining device is configured to cause the laser light from the reflector to fall on a workpiece to form a machining line in the workpiece.

12. A laser machining device comprising the optical scanning device according to claim 7, wherein
the laser machining device is configured to cause the laser light from the reflector to fall on a workpiece to form a machining line in the workpiece.

13. A laser machining device comprising the optical scanning device according to claim 8, wherein
the laser machining device is configured to cause the laser light from the reflector to fall on a workpiece to form a machining line in the workpiece.

14. The laser machining device according to claim 9, comprising a conveying apparatus configured to convey the workpiece in a conveyance direction at a constant conveyance speed, wherein
the parabolic surface is disposed in such a manner as to extend in a direction crossing the conveyance direction, and
the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

15. The laser machining device according to claim 10, comprising a conveying apparatus configured to convey the workpiece in a conveyance direction at a constant conveyance speed, wherein
the parabolic surface is disposed in such a manner as to extend in a direction crossing the conveyance direction, and
the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

16. The laser machining device according to claim 11, comprising a conveying apparatus configured to convey the workpiece in a conveyance direction at a constant conveyance speed, wherein
the parabolic surface is disposed in such a manner as to extend in a direction crossing the conveyance direction, and
the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

17. The laser machining device according to claim 12, comprising a conveying apparatus configured to convey the workpiece in a conveyance direction at a constant conveyance speed, wherein
the parabolic surface is disposed in such a manner as to extend in a direction crossing the conveyance direction, and
the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

18. The laser machining device according to claim 13, comprising a conveying apparatus configured to convey the workpiece in a conveyance direction at a constant conveyance speed, wherein
the parabolic surface is disposed in such a manner as to extend in a direction crossing the conveyance direction, and
the projector is operated continuously while the conveying apparatus is conveying the workpiece, such that a plurality of machining lines each extending in a scanning direction perpendicular to the conveyance direction are formed in the workpiece in such a manner that the plurality of machining lines are arranged side by side in the conveyance direction.

* * * * *